(12) United States Patent
Noguchi

(10) Patent No.: US 11,637,483 B2
(45) Date of Patent: Apr. 25, 2023

(54) ELECTRONIC COMPONENT FIXATION STRUCTURE AND CURRENT DETECTION DEVICE

(71) Applicant: Mitsubishi Electric Corporation, Tokyo (JP)

(72) Inventor: Masahiro Noguchi, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 266 days.

(21) Appl. No.: 16/991,165

(22) Filed: Aug. 12, 2020

(65) Prior Publication Data

US 2021/0152057 A1 May 20, 2021

(30) Foreign Application Priority Data

Nov. 18, 2019 (JP) .............................. JP2019-207699

(51) Int. Cl.
*H02K 11/27* (2016.01)
*H02K 11/33* (2016.01)
*G01R 15/20* (2006.01)

(52) U.S. Cl.
CPC ........... *H02K 11/27* (2016.01); *G01R 15/207* (2013.01); *H02K 11/33* (2016.01); *H02K 2211/03* (2013.01)

(58) Field of Classification Search
CPC .... G01R 15/207; G01R 15/202; G01R 33/07; G01R 15/20; H02K 11/33; H02K 11/27; H02K 2211/03

(Continued)

(56) References Cited

U.S. PATENT DOCUMENTS 4,972,140 A * 11/1990 Okazaki ............... G01R 15/202
324/117 R
2003/0227284 A1* 12/2003 Marasch .............. G01R 15/247
324/117 H (Continued)

FOREIGN PATENT DOCUMENTS

EP       3244216 A1   11/2017
JP     2013027203 A    2/2013

(Continued)

OTHER PUBLICATIONS

Takizawa et al, Current Detector, Jul. 11, 2019, JP 2019113430 (English Machine Translation) (Year: 2019).*

(Continued)

*Primary Examiner* — Alexander A Singh
(74) *Attorney, Agent, or Firm* — Sughrue Mion, PLLC; Richard C. Turner

(57) ABSTRACT

An electronic component fixation structure disclosed in the present application includes a holding member which, being made of an insulating material, is formed of a storing portion which stores a main body portion of an electronic component, a protection portion which surrounds a plurality of connection terminals of the electronic component, and a pair of protrusion portions which protrude upward from the respective central portions of a pair of side walls of the protection portion; and a wiring substrate on which to connect between electronic components, wherein the pair of protrusion portions of the holding member are engaged with the wiring substrate, and the plurality of connection terminals of the electronic component are solder connected to the wiring substrate.

19 Claims, 7 Drawing Sheets

(58) Field of Classification Search
USPC .................................... 310/68 B, 68 C, 68 R
See application file for complete search history.

(56) References Cited

U.S. PATENT DOCUMENTS

| | | | | |
|---|---|---|---|---|
| 2013/0147474 A1* | 6/2013 | Nakajima | ............... | G01R 33/07 |
| | | | | 324/253 |
| 2014/0140119 A1 | 5/2014 | Shinohara et al. | | |
| 2015/0042324 A1* | 2/2015 | Fujita | ..................... | G01R 33/07 |
| | | | | 324/244 |
| 2016/0128195 A1* | 5/2016 | Matsunaga | ............ | H05K 3/303 |
| | | | | 29/841 |
| 2018/0128860 A1 | 5/2018 | Kinoshita et al. | | |

FOREIGN PATENT DOCUMENTS

| | | | |
|---|---|---|---|
| JP | 2016-109601 A | | 6/2016 |
| JP | 2016125955 A | | 7/2016 |
| JP | 2018-072295 A | | 5/2018 |
| JP | 2018072295 A | | 5/2018 |
| JP | 2019113430 A | * | 7/2019 |

OTHER PUBLICATIONS

Communication from the Japanese Patent Office dated Sep. 29, 2020 in Application No. 2019-207699.
Communication dated Apr. 20, 2021, from the Japanese Patent Office in application No. 2019-207699.

* cited by examiner

ELECTRONIC COMPONENT FIXATION STRUCTURE AND CURRENT DETECTION DEVICE

BACKGROUND OF THE INVENTION

Field of the Invention

The present application relates to the field of an electronic component fixation structure which is used for an in-vehicle power conversion apparatus.

Description of the Related Art

In a vehicle using an electric motor as a power source, the electric motor is driven with power from a battery, so that a power conversion apparatus, such as an inverter or a converter, is mounted on the vehicle. In a drive circuit for the power conversion apparatus, an in-vehicle power module is adopted and, by being element driven, supplies required power, so that a current sensor which detects current outputted to the electric motor is mounted on the power conversion apparatus.

As this kind of current sensor mounted on the power conversion apparatus, a current sensor is known which, being configured by enclosing a current passing conductor with a core having a gap formed in one circumferential portion thereof and then disposing in the gap a Hall element (a magnetism detection element) which detects the density of magnetic fluxes generated in the gap, detects current flowing in response to the density of magnetic fluxes in the Hall element (for example, PTL 1).

Also, in this kind of current sensor, it is necessary to install a Hall element in a gap portion provided in a core which collects magnetism, so that the current sensor adopts not the structure in which the Hall element is mounted on a substrate, but the structure in which the Hall element is disposed in the gap portion of the core using a lead type package with the Hall element resin sealed therein (for example, PTL 2).

[PTL 1] JP-A-2016-109601
[PTL 2] JP-A-2018-072295

However, the heretofore known technologies have the following kind of problem.

Miniaturization and high vibration resistance have heretofore been required for the power conversion apparatus. Therefore, in a heretofore known kind of structure in which a lead type package with a Hall element sealed therein is mounted on a substrate, the size of a sensor portion increases due to securing the insulation distance of an exposed portion of a lead, or a lead portion connected to a wiring substrate is low in strength, so that vibration resistance strength is not sufficient, and vibration generated when a vehicle on which is mounted the power conversion apparatus runs can affect detection accuracy, making it difficult to achieve miniaturization and higher vibration resistance which are required for the power conversion apparatus.

SUMMARY OF THE INVENTION

The present application has been made to solve the above problem, and an object of the present application is to provide an electronic component fixation structure and a current detection device which respond to the requirement for miniaturization and high vibration resistance of a power conversion apparatus.

An electronic component fixation structure disclosed in the present application, in which to fix an electronic component which is formed of a main body portion with a semiconductor element resin sealed therein and a plurality of connection terminals which, being connected to the semiconductor element, are formed protruding from the main body portion, includes a holding member which, being made of an insulating material, is formed of a storing portion which stores the main body portion, a protection portion which surrounds the plurality of connection terminals, and a pair of protrusion portions which protrude upward from the respective central portions of a pair of side walls of the protection portion; and a wiring substrate on which to connect between electronic components, wherein the pair of protrusion portions of the holding member are engaged with the wiring substrate, and the plurality of connection terminals of the semiconductor element are solder connected to the wiring substrate.

According to the electronic component fixation structure disclosed in the present application, the electronic component in which the semiconductor element is resin sealed can be reliably fixed to the wiring substrate with miniaturization and high vibration resistance achieved.

The foregoing and other objects, features, and advantageous effects of the present application will become more apparent from detailed description in the following embodiments and description in the accompanying drawings.

DETAILED DESCRIPTION OF THE PREFERRED EMBODIMENTS

First Embodiment

Hereinafter, a description will be given, using the drawings, of the embodiments in the present application. In the individual drawings, identical or equivalent portions will be described given given identical signs.

Figure 1:
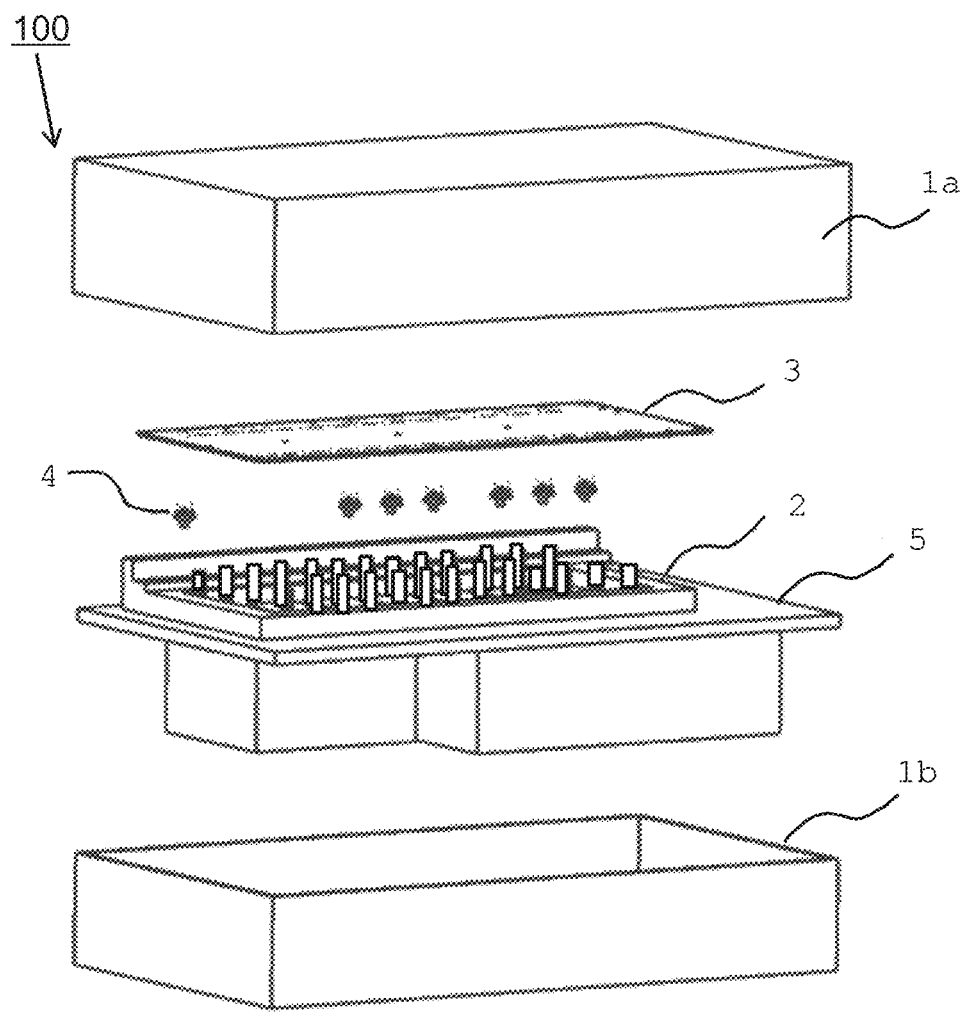
FIG. 1 is a developed perspective view showing an overall configuration of a power conversion apparatus which adopts an electronic component fixation structure according to the first embodiment.
Figure 2:
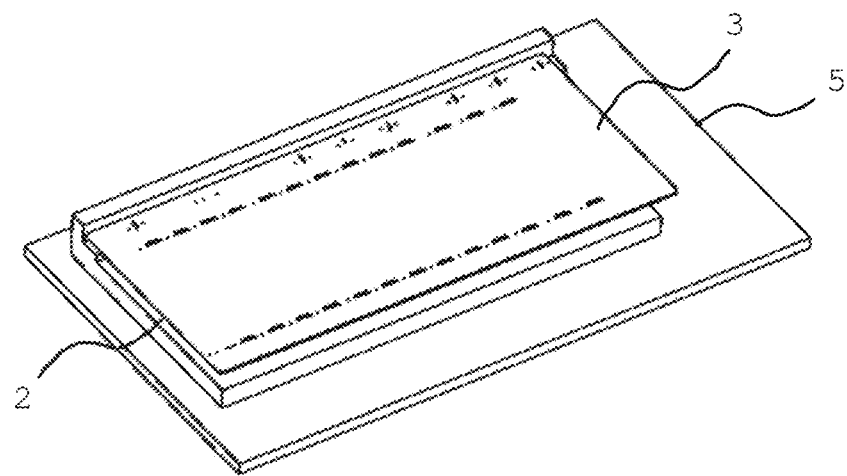
FIG. 2 is a perspective view showing a main portion configuration of the power conversion apparatus in FIG. 1.
Figure 3:
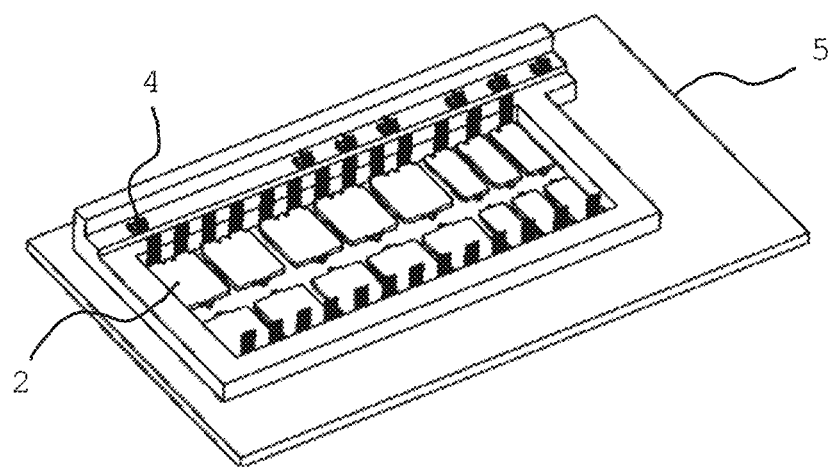
FIG. 3 is a perspective view showing a main portion configuration of the power conversion apparatus in FIG. 1.

FIG. 1 is a developed perspective view showing an overall configuration of a power conversion apparatus which adopts an electronic component fixation structure according to the first embodiment, and FIGS. 2 and 3 are perspective views each showing a main portion of the power conversion apparatus in FIG. 1. In the drawings, a power conversion apparatus 100 is configured including an upper and a lower cases 1a and 1b which store the whole, a power module 2 which generates power with which to drive an electric motor, a wiring substrate 3 on which to connect between the power module 2 and other electronic components and thus to form a control circuit for the power module 2, a current detection device 4 which detects output current from the power module 2, and a cooler 5 which, having mounted thereon the power module 2, dissipates heat generated by the power module 2.

Figure 4:
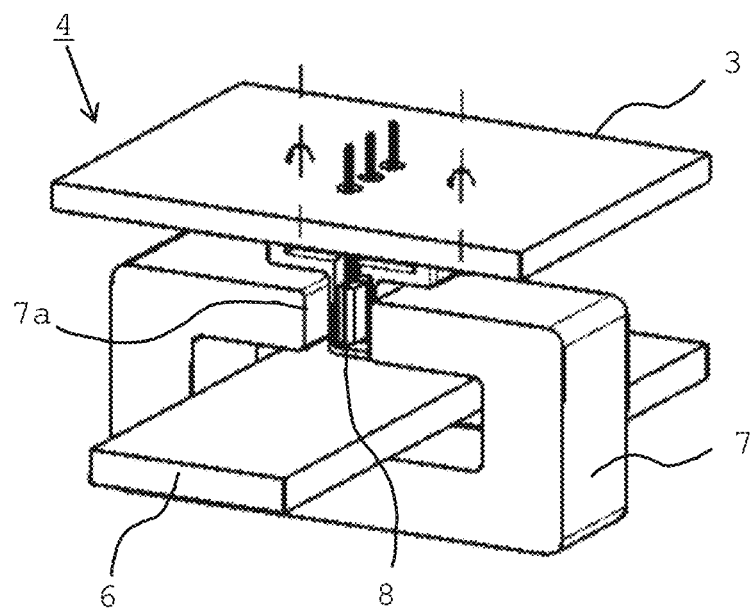
FIG. 4 is a perspective view showing a current detection device which is a main portion of the power conversion apparatus in FIG. 1.
Figure 5:
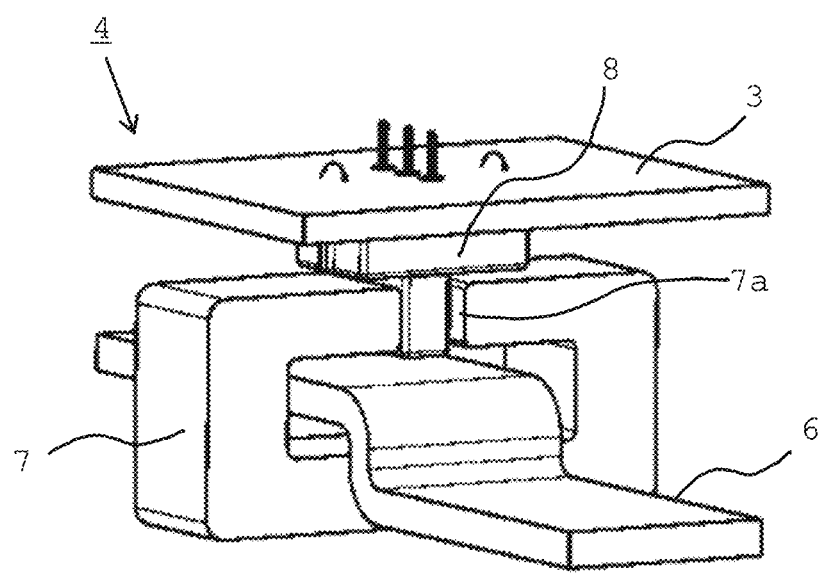
FIG. 5 is a perspective view of the current detection device in FIG. 4 as seen from the other side.
Figure 6:
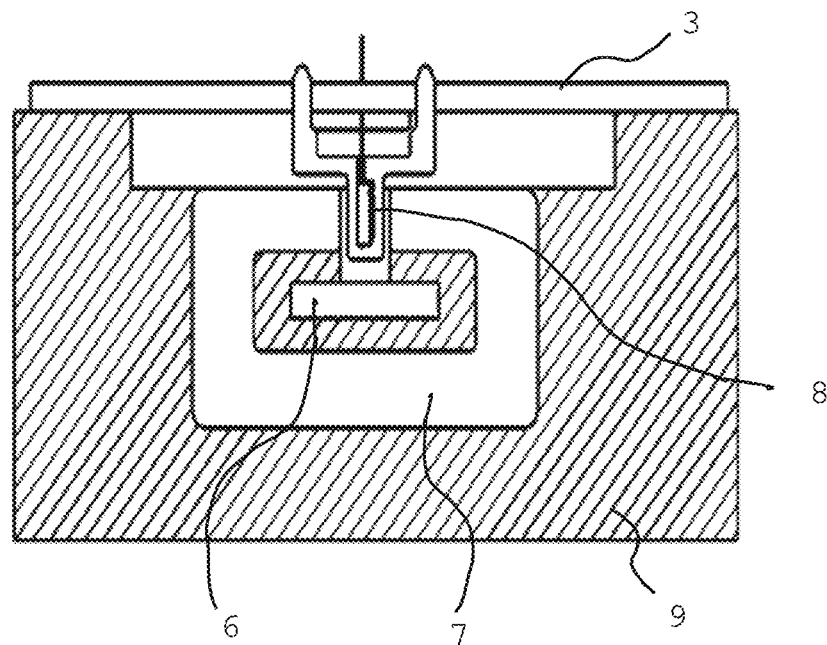
FIG. 6 is a sectional view showing a detailed configuration of the current detection device according to the first embodiment.

Also, FIGS. 4 and 5 are perspective views showing the outline of the current detection device 4 in FIG. 1 as seen, respectively, from the front and back thereof. In the drawings, the current detection device 4 is formed of a conductor 6, such as a bus bar, which electrically connects a rotary electric machine and an inverter (the power conversion apparatus) which supplies drive current to the rotary electric machine and controls the rotation of the rotary electric machine, a core 7 which is disposed adjacent to the conductor 6 so as to surround the conductor 6, and a current detection section 8 which, being disposed in a groove portion 7a provided in one portion of the core 7, detects a magnetic flux, which flows through the groove portion 7a in response to current flowing through the conductor 6, and converts the magnetic flux to current. Also, the connection terminals of an electronic component in the current detection section 8 are connected to the wiring substrate 3 by soldering. Furthermore, as shown in FIG. 6, the conductor 6 and the core 7 are integrally molded and fixed by a resin 9, and the wiring substrate 3 is mounted on an upper surface portion of the resin 9.

Figure 7:
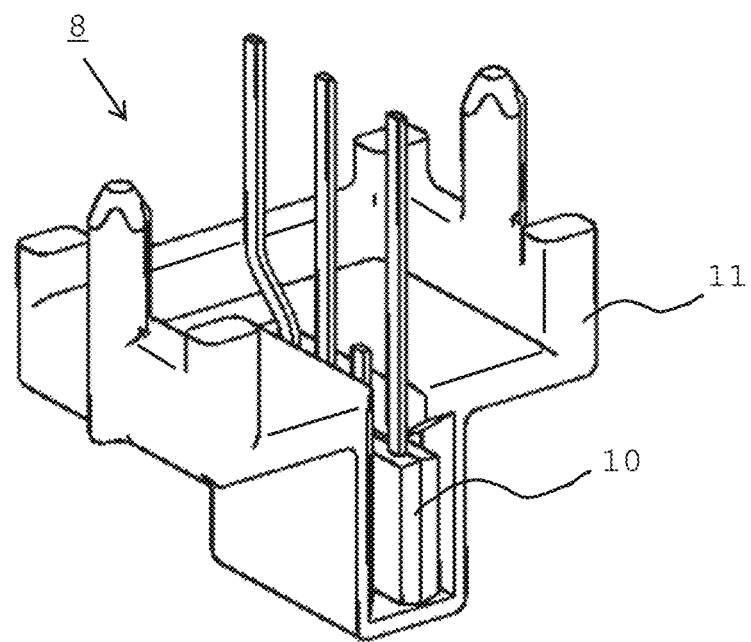
FIG. 7 is a perspective view showing a detailed configuration of a current detection section according to the first embodiment.
Figure 8:
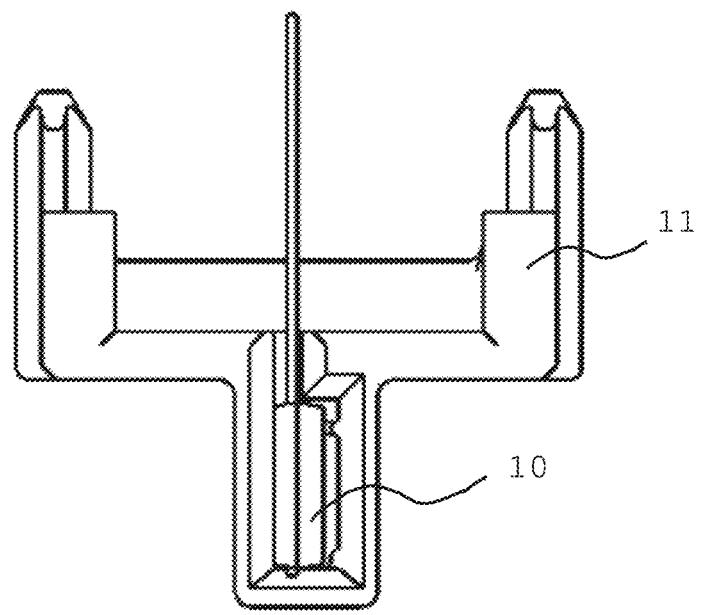
FIG. 8 is a front view of FIG. 7.

Here, as shown in FIGS. 7 and 8, the current detection section 8 is configured of a Hall IC 10 which is an electronic component for magnetism detection and a holding member 11 which holds the Hall IC 10.

Figure 9:
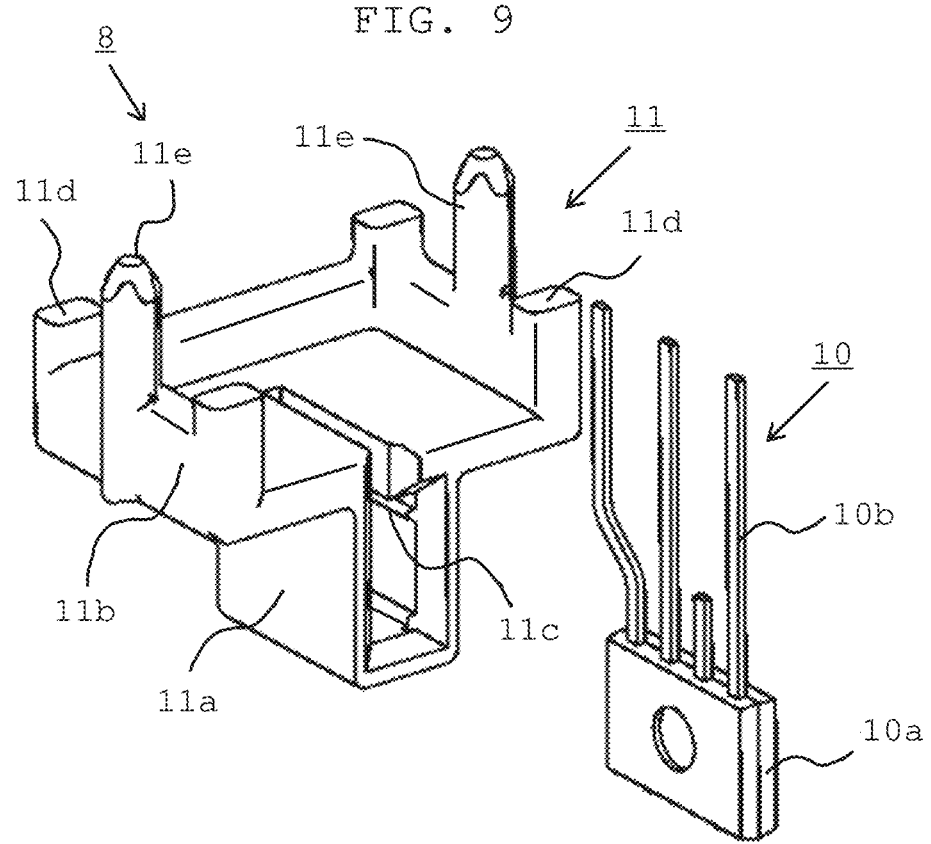
FIG. 9 is a developed perspective view showing the current detection section in FIG. 7.

Also, as shown in FIG. 9, the Hall IC 10 has a main body portion 10a which, having a semiconductor element sealed therein with insulating resin, is formed in a flat plate and a plurality of connection terminals 10b which, being connected to the semiconductor element, are formed protruding from the main body portion 10a.

On the other hand, the holding member 11, being made of an insulating material, is configured of a storing portion 11a which, being front and top opened, has formed therein a groove in which to house the main body portion 10a of the Hall IC 10 and a protection portion 11b which, spreading right and left from the upper end of the storing portion 11a and being extended upward, surrounds the connection terminals 10b of the Hall IC 10 in three directions.

Furthermore, the storing portion 11a is provided with a protrusion 11c which protrudes inward from an up-down position on the inside of the groove, also, planar portions 11d are formed one on each of the respective upper ends of the corners of the protection portion 11b, and furthermore, a pair of protrusion portions 11e are formed which protrude upward one from each of the respective central portions of a pair of side walls of the protection portion 11b. The pair of protrusion portions 11e are provided in respective positions wherein the line connecting the pair of protrusion portions 11e is perpendicular to the direction of alignment of the plurality of connection terminals 10b of the Hall IC 10.

When assembling the current detection section 8 under this kind of configuration, first, the main body portion 10a of the Hall IC 10 is inserted into the storing portion 11a of the holding member 11. At this time, the width of the portion of the groove having the protrusion 11c provided inside the storing portion 11a is preformed to be slightly smaller than the thickness of the main body portion 10a, thereby meaning that the main body portion 10a is press fitted into the groove, and thereby the main body portion 10a and the groove can be mechanically joined together, as shown in FIGS. 7 and 8. Also, the plurality of connection terminals 10b of the Hall IC 10 are surrounded in the three directions by the protection portion 11b of the holding member 11, and the connection terminals 10b can be prevented from breaking by colliding against another member.

Next, the Hall IC 10 and the holding member 11 are superimposed on the wiring substrate 3, and the connection terminals 10b of the Hall IC 10 are inserted into their respective connection holes provided in the wiring substrate 3, along with which the protrusion portions 11e of the holding member 11 are press fitted into their respective fitting holes, superimposing the wiring substrate 3 on the planar portions 11d of the holding member 11. After that, the connection terminals 10b of the Hall IC 10 are soldered to the wiring substrate 3.

Figure 10:
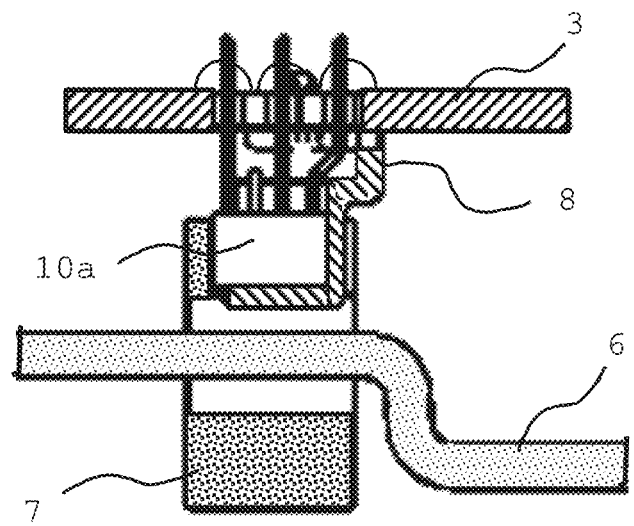
FIG. 10 is a view showing in section the current detection device in FIG. 5.

In this way, the protrusion and planar portions 11e and 11d of the holding member 11 are engaged with the wiring substrate 3, and the connection terminals 10b of the Hall IC 10 are soldered, thereby enabling the holding member 11 and the Hall IC 10 to be reliably fixed to the wiring substrate 3 as shown in FIG. 10.

Next, the core 7 and the conductor 6, with a positional relationship maintained therebetween, are molded into one with the resin 9, as shown in FIG. 6, and after the main body portion 10a of the Hall IC 10 is inserted into the groove portion 7a of the core 7, the wiring substrate 3 is mounted on the upper surface of the resin 9, and finally, is fixed in the cases 1a, 1b, thereby manufacturing the power conversion apparatus 100.

As in the above way, the pair of protrusion portions 11e of the holding member 11 are provided in their respective positions, the line between which is perpendicular to the direction of alignment of the plurality of connection terminals 10b of the Hall IC 10, and the pair of protrusion portions 11e are fitted in the wiring substrate 3, along with which the plurality of connection terminals 10b are solder fixed in the wiring substrate 3, thereby enabling the Hall IC 10 to be reliably held even against vibration to which a vehicle with the apparatus 100 mounted thereon in practice is subjected when running, as a result of which it is possible to reduce a displacement relative to the core 7, and possible to reduce stress generated in the connection terminals 10b of the Hall IC 10, enabling an improvement in current detection accuracy and in vibration resistance strength.

Furthermore, the planar portions 11d which are to abut the wiring substrate 3 are provided in respective portions of the holding member 11 in the vicinity of the pair of protrusion portions 11e, and thereby the management of assembly margins when assembling the protrusion portions 11e is facilitated, contributing not only to an improvement in productivity, but the number of holding portions with which to suppress a relative displacement between the wiring substrate 3 and the holding member 11 against vibration increases, thus enabling a contribution also to an improvement in vibration resistance.

Also, a tie bar cut mark occurs in a lower end portion of the Hall IC 10 due to tie bar cutting in the process of manufacturing the Hall IC 10, but the lower end side of the Hall IC 10 is embraced by the holding member 11 made of an insulating resin, as shown in FIG. 6, thereby enabling securing of insulation from the conductor 6 through which to cause high power to pass, and it is possible to bring the Hall IC 10 and the conductor 6 closer in distance to each other, and possible to miniaturize the current detection section 8.

In addition, the connection terminal of the power module 2, to which is connected the conductor 6 through which to cause current to flow, and the connection terminals of the Hall IC 10 are extended in the same direction and thereby can both be connected to the same wiring substrate 3, enabling a rationalization of the manufacturing process of solder joining the connection terminal of the power module and the connection terminals 10b of the Hall IC 10 to the wiring substrate 3. Consequently, the current detection device 4 can be configured at a low cost.

Figure 11:
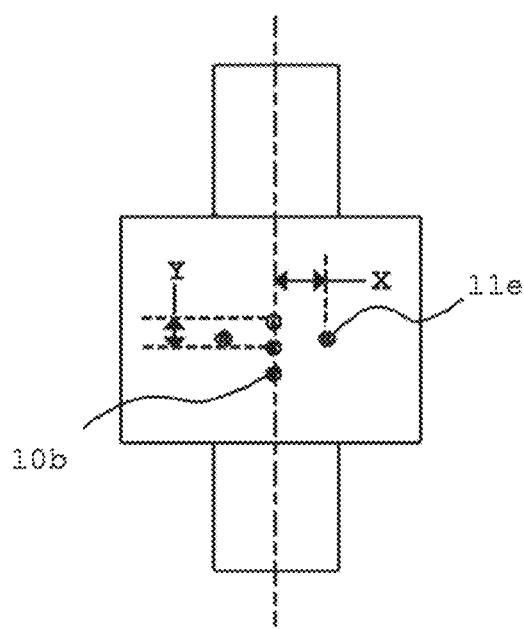
FIG. 11 is a plan view showing a main portion configuration of the current detection device according to the first embodiment.

Also, as shown in FIG. 11, a distance X between one of the pair of protrusion portions 11e of the holding member 11 and the alignment of the plurality of connection terminals 10b of the Hall IC 10 is taken to be larger than a distance Y between adjacent ones of the plurality of connection terminals 10b of the Hall IC 10, and thereby it is possible to prevent a problem in that bridging occurs in an electrical and a mechanical connection portion when soldering, or that a resin portion of the holding member 11 melts due to the heat of a solder.

Second Embodiment

Figure 12A:
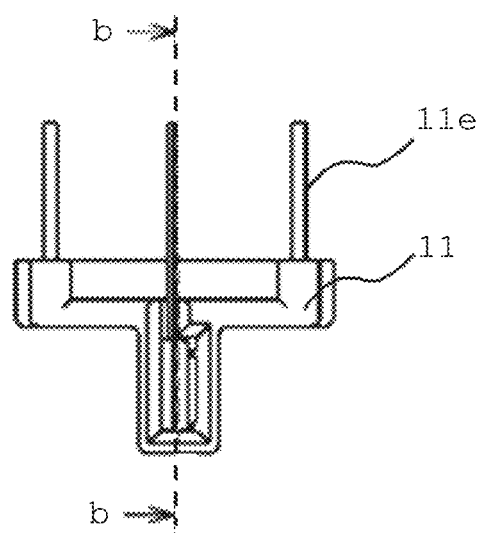
FIGS. 12A and 12B represents a front view and a sectional side view which show a main portion configuration of a current detection device according to the second embodiment.
Figure 12B:
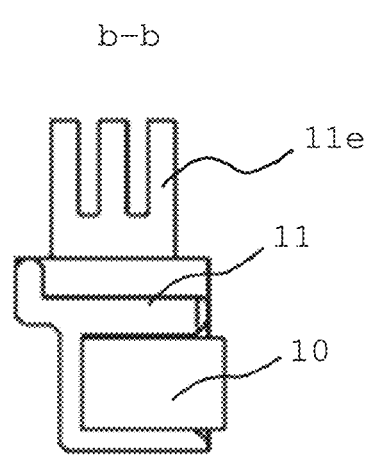

FIGS. 12A and 12B represents a front view and a sectional side view which show a main portion configuration of a current detection device according to the second embodiment.

In the above described first embodiment, a configuration is adopted such that the pair of protrusion portions 11e of the holding member 11 are press fitted into the wiring substrate 3, but in the second embodiment, a steel plate is insert molded in the holding member 11, forming protrusion portions 11e, so that the holding member 11 can be more firmly fixed to the wiring substrate 3 by soldering the protrusion portions 11e to the wiring substrate 3.

In the above described embodiments, a description is given of one wherein the plurality of connection terminals 10b of the Hall IC 10 are disposed in a linear manner, but the same advantageous effects can be obtained even with a Hall IC 10 wherein a plurality of connection terminals 10b are disposed staggering in the direction perpendicular to a virtual line connecting the pair of protrusion portions 11e.

Also, a description is given of the case of fixing the Hall IC 10, but the embodiments can also be applied to the case of fixing a lead type electronic component in which a semiconductor element is sealed.

Although the present application is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations, to one or more of the embodiments.

It is therefore understood that numerous modifications which have not been exemplified can be devised without departing from the scope of the present application. For example, at least one of the constituent components may be modified, added, or eliminated. At least one of the constituent components mentioned in at least one of the preferred embodiments may be selected and combined with the constituent component mentioned in another preferred embodiment.

What is claimed is:

1. An electronic component fixation structure in which to fix an electronic component which is formed of a main body portion with a semiconductor element resin sealed therein and a plurality of connection terminals which, being connected to the semiconductor element, are formed protruding from the main body portion, comprising:
   a holding member which, being made of an insulating material, is formed of a storing portion which stores the main body portion, a protection portion which surrounds the plurality of connection terminals, and a pair of protrusion portions which protrude upward from the respective central portions of a pair of side walls of the protection portion;
   a wiring substrate on which to connect between a plurality of electronic components;
   a power module which, being connected to the wiring substrate, generates power with which to drive a rotary electric machine;
   a conductor which supplies the rotary electric machine with the output from the power module;
   a core which, being provided adjacent to the conductor, is provided in one portion thereof a groove portion, wherein the main body portion of the semiconductor element is disposed in the groove portion; and
   a cooler which, having mounted thereon the power module, dissipates heat generated by the power module, wherein
   the conductor and the core are molded integrally with resin and fixed to the cooler, and wherein
   the pair of protrusion portions of the holding member are engaged with the wiring substrate, and the plurality of connection terminals of the semiconductor element are solder connected to the wiring substrate.

2. The electronic component fixation structure according to claim 1, wherein
   the storing portion of the holding member, being front and top opened, is configured of a groove in which to store the main body portion of the electronic component and a protrusion which protrudes toward the inside of the groove.

3. The electronic component fixation structure according to claim 2, wherein
   the protection portion of the holding member has planar portions, one on each of the respective upper ends of the corner portions thereof, and the wiring substrate is superimposed on the planar portions.

4. The electronic component fixation structure according to claim 3, wherein
   the electronic component is a Hall IC.

5. A current detection device using the electronic component fixation structure according to claim 4, comprising:
   a power module which, being connected to the wiring substrate, generates power with which to drive a rotary electric machine; a conductor which supplies the rotary electric machine with the output from the power module; and a core which, being provided adjacent to the conductor, is provided in one portion thereof a groove portion, wherein the storing portion of the holding member in which is stored the main body portion of the Hall IC is disposed in the groove portion of the core.

6. The electronic component fixation structure according to claim 2, wherein
the electronic component is a Hall IC.

7. A current detection device using the electronic component fixation structure according to claim 6, comprising:
a power module which, being connected to the wiring substrate, generates power with which to drive a rotary electric machine; a conductor which supplies the rotary electric machine with the output from the power module; and a core which, being provided adjacent to the conductor, is provided in one portion thereof a groove portion, wherein
the storing portion of the holding member in which is stored the main body portion of the Hall IC is disposed in the groove portion of the core.

8. The electronic component fixation structure according to claim 1, wherein
the protection portion of the holding member has planar portions, one on each of the respective upper ends of corner portions thereof, and the wiring substrate is superimposed on the planar portions, and the protrusion portions protrude through the wiring substrate, and wherein the planar portions exist in a first plane and the protrusion portions exist in a second plane, wherein the first plane is further away from the wiring substrate than the second plane.

9. The electronic component fixation structure according to claim 8, wherein
the electronic component is a Hall IC.

10. A current detection device using the electronic component fixation structure according to claim 9, comprising:
a power module which, being connected to the wiring substrate, generates power with which to drive a rotary electric machine; a conductor which supplies the rotary electric machine with the output from the power module; and a core which, being provided adjacent to the conductor, is provided in one portion thereof a groove portion, wherein
the storing portion of the holding member in which is stored the main body portion of the Hall IC is disposed in the groove portion of the core.

11. The electronic component fixation structure according to claim 1, wherein
the pair of protrusion portions of the holding member are provided in respective positions wherein the line connecting the pair of protrusion portions is perpendicular to the direction of alignment of the plurality of connection terminals of the electronic component.

12. The electronic component fixation structure according to claim 11, wherein
the distance between one of the pair of protrusion portions of the holding member and the alignment of the plurality of connection terminals of the electronic component is taken to be larger than the distance between adjacent ones of the plurality of connection terminals of the electronic component.

13. The electronic component fixation structure according to claim 12, wherein
the electronic component is a Hall IC.

14. A current detection device using the electronic component fixation structure according to claim 13, comprising:
a power module which, being connected to the wiring substrate, generates power with which to drive a rotary electric machine; a conductor which supplies the rotary electric machine with the output from the power module; and a core which, being provided adjacent to the conductor, is provided in one portion thereof a groove portion, wherein
the storing portion of the holding member in which is stored the main body portion of the Hall IC is disposed in the groove portion of the core.

15. The electronic component fixation structure according to claim 11, wherein
the electronic component is a Hall IC.

16. A current detection device using the electronic component fixation structure according to claim 15, comprising:
a power module which, being connected to the wiring substrate, generates power with which to drive a rotary electric machine; a conductor which supplies the rotary electric machine with the output from the power module; and a core which, being provided adjacent to the conductor, is provided in one portion thereof a groove portion, wherein
the storing portion of the holding member in which is stored the main body portion of the Hall IC is disposed in the groove portion of the core.

17. The electronic component fixation structure according to claim 1, wherein
the electronic component is a Hall IC.

18. A current detection device using the electronic component fixation structure according to claim 17, comprising:
a power module which, being connected to the wiring substrate, generates power with which to drive a rotary electric machine; a conductor which supplies the rotary electric machine with the output from the power module; and a core which, being provided adjacent to the conductor, is provided in one portion thereof a groove portion, wherein
the storing portion of the holding member in which is stored the main body portion of the Hall IC is disposed in the groove portion of the core.

19. An electronic component fixation structure in which to fix an electronic component which is formed of a main body portion with a semiconductor element resin sealed therein and a plurality of connection terminals which, being connected to the semiconductor element, are formed protruding from the main body portion, comprising:
a holding member which, being made of an insulating material, is formed of a storing portion which stores the main body portion, a protection portion which surrounds the plurality of connection terminals, and a pair of protrusion portions which protrude upward from the respective central portions of a pair of side walls of the protection portion; and a wiring substrate on which to connect between electronic components, wherein
the pair of protrusion portions of the holding member are engaged with the wiring substrate, and the plurality of connection terminals of the semiconductor element are solder connected to the wiring substrate, and
the protrusion portions of the holding member are configured by insert molding a steel plate in the holding member.

* * * * *